US009559349B2

(12) United States Patent
Braun et al.

(10) Patent No.: US 9,559,349 B2
(45) Date of Patent: Jan. 31, 2017

(54) METHOD OF FABRICATING A THREE-DIMENSIONAL (3D) POROUS ELECTRODE ARCHITECTURE FOR A MICROBATTERY

(71) Applicant: The Board of Trustees of the University of Illinois, Urbana, IL (US)

(72) Inventors: Paul V. Braun, Savoy, IL (US); Hailong Ning, Urbana, IL (US); Kevin A. Arpin, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 391 days.

(21) Appl. No.: 14/321,077

(22) Filed: Jul. 1, 2014

(65) Prior Publication Data

US 2014/0314948 A1 Oct. 23, 2014

Related U.S. Application Data

(63) Continuation-in-part of application No. 14/235,338, filed as application No. PCT/US2012/048057 on Jul. 25, 2012.

(Continued)

(51) Int. Cl.
*H01M 4/28* (2006.01)
*H01M 4/40* (2006.01)
(Continued)

(52) U.S. Cl.
CPC .............. *H01M 4/04* (2013.01); *G03F 7/0035* (2013.01); *H01M 4/0404* (2013.01); *H01M 4/80* (2013.01); *B33Y 80/00* (2014.12)

(58) Field of Classification Search
CPC ........ H01M 4/04; H01M 4/0404; H01M 4/80; B33Y 8/00; G03F 7/0035
See application file for complete search history.

(56) References Cited

U.S. PATENT DOCUMENTS 5,403,680 A * 4/1995 Otagawa ................. H01M 4/60
204/192.1
6,680,013 B1 1/2004 Stein et al.
(Continued)

OTHER PUBLICATIONS

International Search Report for International PCT Application No. PCT/US2011/020301, mailing date Aug. 30, 2011, pp. 1-4.
(Continued)

*Primary Examiner* — Kenneth Douyette
(74) *Attorney, Agent, or Firm* — Brinks Gilson & Lione

(57) ABSTRACT

A method of fabricating a 3D porous electrode architecture comprises forming a microbattery template that includes (a) a lattice structure comprising a first lattice portion separated from a second lattice portion on a substrate, and (b) a solid structure on the substrate including a separating portion between the first and second lattice portions. Interstices of the first lattice portion are infiltrated with a first conductive material and interstices of the second lattice portion are infiltrated with a second conductive material. Each of the first and second conductive materials fill the interstices to reach a predetermined thickness on the substrate. The solid structure and the lattice structure are removed from the structure, thereby forming first and second conductive scaffolds comprising a porosity defined by the lattice structure and having a lateral size and shape defined by walls of the solid structure.

20 Claims, 11 Drawing Sheets

Related U.S. Application Data

(60) Provisional application No. 61/513,178, filed on Jul. 29, 2011.

(51) Int. Cl.
|         |           |
|---------|-----------|
| H01M 4/04 | (2006.01) |
| H01M 4/08 | (2006.01) |
| H01M 4/80 | (2006.01) |
| G03F 7/00 | (2006.01) |
| B33Y 80/00 | (2015.01) |

(56) References Cited

U.S. PATENT DOCUMENTS

| 7,745,249 B2 | 6/2010 | Lee et al. |
| 8,237,538 B2 | 8/2012 | Braun et al. |
| 2004/0195096 A1 | 10/2004 | Tsamis et al. |
| 2005/0233198 A1* | 10/2005 | Nuzzo ................. H01M 4/8605 204/432 |
| 2008/0081256 A1* | 4/2008 | Madou .................. H01M 4/133 429/209 |
| 2008/0246580 A1 | 10/2008 | Braun et al. |
| 2008/0261297 A1 | 10/2008 | Chaffey et al. |
| 2009/0011316 A1 | 1/2009 | Tuller et al. |
| 2010/0065889 A1 | 3/2010 | Braun et al. |
| 2010/0068623 A1 | 3/2010 | Braun et al. |
| 2011/0045346 A1 | 2/2011 | Chiang et al. |

OTHER PUBLICATIONS

Atwater, H.A. et al., "Plasmonics for Improved Photovoltaic Devices," *Nature Materials* 9, (2010) pp. 205-213.

Braun, P.V. et al., "Electrochemical Fabrication of 3D Microperiodic Porous Materials," *Adv. Mater.* 13, 7 (2001) pp. 482-485.

Braun, P.V. et al., "Electrochemically Grown Photonic Crystals," *Nature* 402 (1999) pp. 603-604.

El-Hallag, I.S., "Characterization of Electrodeposited Nanostructured Macroporous Cobalt Films Using Polystyrene Sphere Templates," *Material Science-Poland* 28, 1 (2010) pp. 245-253.

Johnson, S., "Photonic Crystals: Periodic Surprises in Electromagnetism," *IAP Tutorial Series* (2003) pp. 1/1-15.

Kuo, et al., "Fabrication of Patterned Inverse Opal Structure Through Physical Confinement Assembly and Selective Electrochemical Deposition," *J. Am. Ceram. Soc.*, 90, 6 (2007) pp. 1956-1958.

Lai, M. et al., "Templated Electrosynthesis of Nanomaterials and Porous Structures," *Journal of Colloid and Interface Science* 323 (2008) pp. 203-212.

Lee, C. et al., "Optical Nanomechanical Sensor Using a Silicon Photonic Crystal Cantilever Embedded with a Nanocavity Resonator," *Applied Optics* 48, 10 (2009) pp. 1797-1803.

Lee, J-H. et al., "Density-Controlled Growth and Field Emission Property of Aligned ZnO Nanorod Arrays," *Appl. Phys. A* 97 (2009) pp. 403-408.

Li, X.V. et al., "Fabrication of Plasmonic Au Nanovoid Trench Arrays by Guided Self-Assembly," *Nanotechnology* 20, (2009) pp. 1-9.

Yu, X. et al., "Filling Fraction Dependent Properties of Inverse Opal Metallic Photonic Crystals," *Adv. Mater.* 19 (2007) pp. 1689-1692.

International Search Report and Written Opinion for International PCT No. PCT/US2012/048057, mailing date Oct. 1, 2012, pp. 1-11.

Ahn, Jong-Hyun et al., "Heterogeneous Three-Dimensional Electronics by Use of Printed Semiconductor Nanomaterials," *Science*, 314 (2006) pp. 1754-1757.

Aricò, Antonino Salvatore et al., "Nanostructured materials for advanced energy conversion and storage devices," *Nature Materials*, 4 (2005) pp. 366-377.

Arthur, Timothy S. et al., "Three-dimensional electrodes and battery architectures," *MRS Bulletin*, 36 (2011) pp. 523-531.

Beck, Fritz et al., "Rechargeable batteries with aqueous electrolytes," *Electrochimica Acta*, 45 (2000) pp. 2467-2482.

Bruce, Peter G. et al., "Nanomaterials for Rechargeable Lithium Batteries," *Angew. Chem. Int. Ed.*, 47 (2008) pp. 2930-2946.

Burke, Andrew, "Ultracapacitor technologies and application in hybrid and electric vehicles," *Int. J. Energy Res.*, 34 (2010) pp. 133-151.

Chamran, Fardad et al., "Fabrication of High-Aspect-Ratio Electrode Arrays for Three-Dimensional Microbatteries," *Journal of Microelectromechanical Systems*, 16, 4 (2007) pp. 844-852.

Chen, Y. C. et al., "Holographically fabricated photonic crystals with large reflectance," *Applied Physics Letters*, 91 (2007) pp. 241103-1-241103-3.

Deiss, E. et al., "Modeling of the charge-discharge dynamics of lithium manganese oxide electrodes for lithium-ion batteries," *Electrochimica Acta*, 46 (2001) pp. 4185-4196.

Del Campo, A. et al., "SU-8: a photoresist for high-aspect-ratio and 3D submicron lithography," *J. Micromech. Microeng.*, 17 (2007) pp. R81-R95.

Doyle, Marc et al., "Comparison of Modeling Predictions with Experimental Data from Plastic Lithium Ion Cells," *J. Electrochem. Soc.*, 143, 6 (1996) pp. 1890-1903.

Hosono, Eiji et al., "High-Rate Lithium Ion Batteries with Flat Plateau Based on Self-Nanoporous Structure of Tin Electrode," *Journal of the Electrochemical Society*, 154, 2 (2007) pp. A146-A149.

Kang, Byoungwoo et al., "Battery materials for ultrafast charging and discharging," *Nature*, 458 (2009) pp. 190-193.

Long, Jeffrey W. et al., "Three-Dimensional Battery Architectures," *Chem. Rev.* 104, 10 (2004) pp. 4463-4492.

Lorenz, H. et al., "High-aspect-ratio, ultrathick, negative-tone near-UV photoresist and its applications for MEMS," *Sensors and Actuators*, A 64 (1998) pp. 33-39.

Min, Hong-Seok et al., "Fabrication and properties of a carbon/polypyrrole three-dimensional microbattery," *Journal of Power Sources*, 178 (2008) pp. 795-800.

Miyake, Masao et al., "Fabrication of Three-Dimensional Photonic Crystals Using Multibeam Interference Lithography and Electrodeposition," *Advanced Materials*, 21 (2009) pp. 3012-3015.

Nathan, Menachem et al., Three-Dimensional Thin-Film Li-Ion Microbatteries for Autonomous MEMS, *Journal of Microelectromechanical Systems*, 14, 5 (2005) pp. 879-885.

Park, Junyong et al., "Three-dimensional nanonetworks for giant stretchability in dielectrics and conductors," *Nature Communications*, 3 (2012) pp. 1-8.

Peterman, Mark C. et al., "Building thick photoresist structures from the bottom up," *J. Micromech. Microeng.*, 13 (2003) pp. 380-382.

Pikul, James H. et al., "High-power lithium ion microbatteries from interdigitated three-dimensional bicontinuous nanoporous electrodes," *Nature Communications*, 4 (2013) pp. 1-5.

Pinson, Matthew B. et al., "Theory of SEI Formation in Rechargeable Batteries: Capacity Fade, Accelerated Aging and Lifetime Prediction," *Journal of the Electrochemical Society*, 160, 2 (2013) pp. A243-A250.

Souquet, Jean Louis et al., "Thin film lithium batteries," *Solid State Ionics*, 148 (2002) pp. 375-379.

Stolwijk, N. A. et al., "Mass and charge transport in the PEO-NaI polymer electrolyte system: effects of temperature and salt concentration," *Faraday Discussions*, 134 (2007) pp. 157-169.

Verma, Pallavi et al., "A review of the features and analyses of the solid electrolyte interphase in Li-ion batteries," *Electrochimica Acta*, 55 (2010) pp. 6332-6341.

Wang, Chia-Wei et al., "Mesoscale Modeling of a Li-Ion Polymer Cell," *Journal of the Electrochemical Society*, 154, 11 (2007) pp. A1035-A1047.

Xu, Kang, "Nonaqueous Liquid Electrolytes for Lithium-Based Rechargeable Batteries," *Chemical Reviews*, 104, 10 (2004) pp. 4303-4417.

Zadin, Vahur et al., "Modelling electrode material utilization in the trench model 3D-microbattery by finite element analysis," *Journal of Power Sources*, 195 (2010) pp. 6218-6224.

(56) References Cited

OTHER PUBLICATIONS

Zhang, Huigang et al., "Three-dimensional bicontinuous ultrafast-charge and -discharge bulk battery electrodes," *Nature Nanotechnology*, 6 (2011) pp. 277-281.

\* cited by examiner

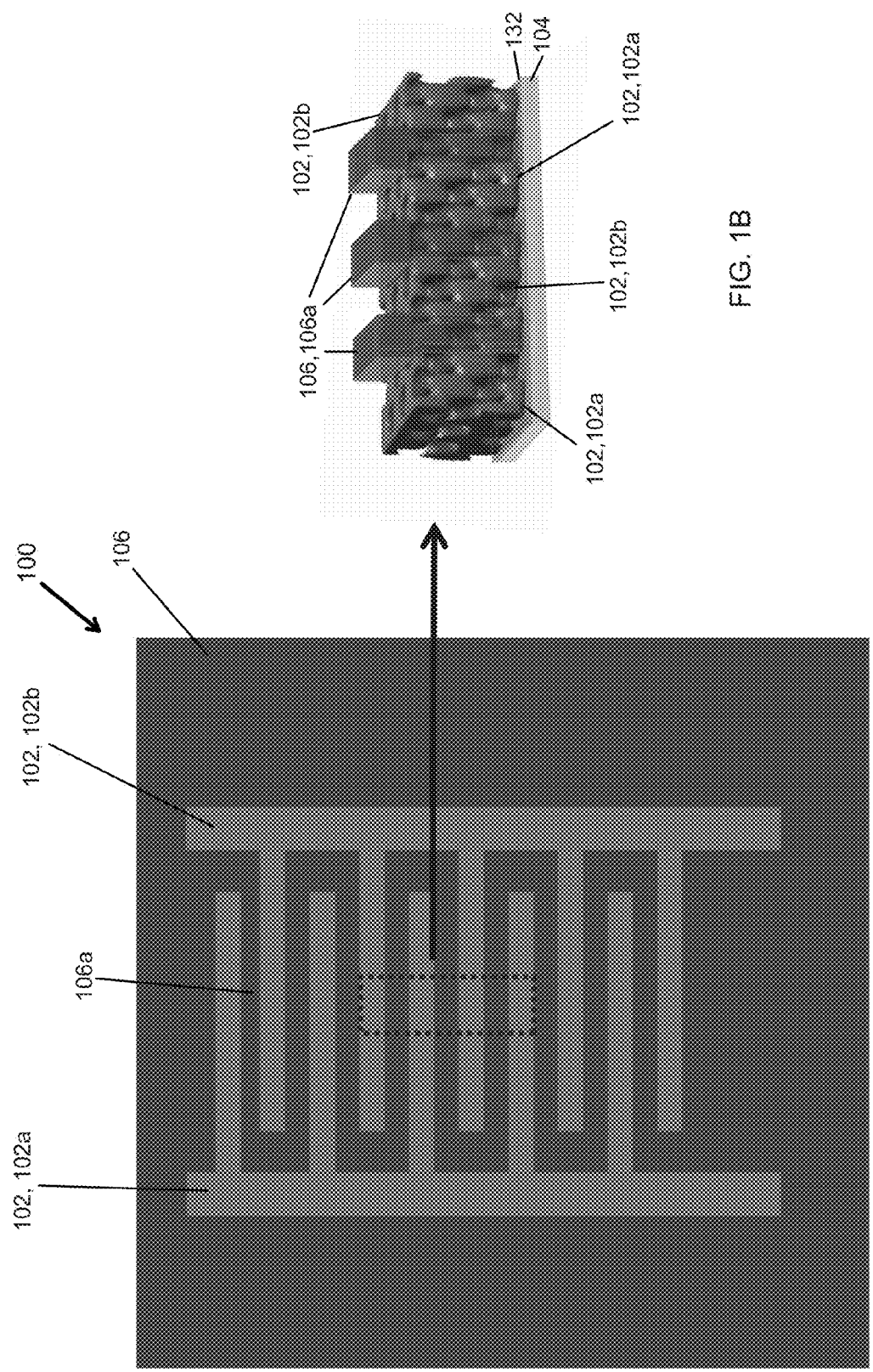

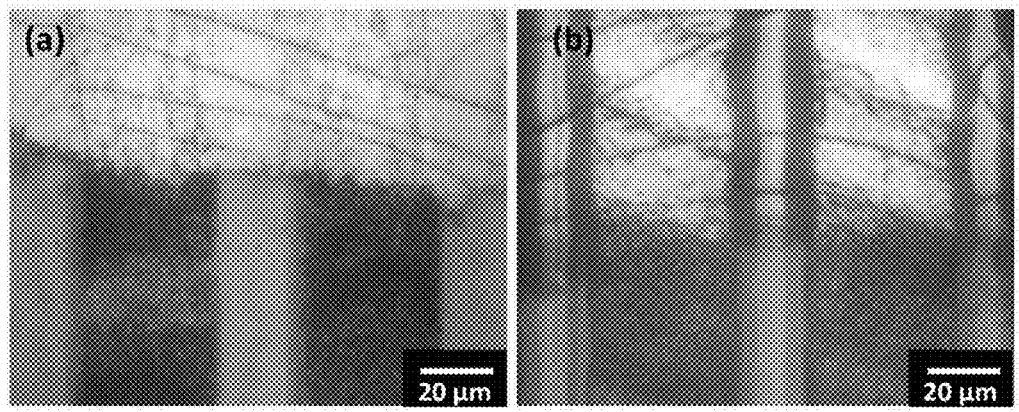
FIGs. 11A and 11B
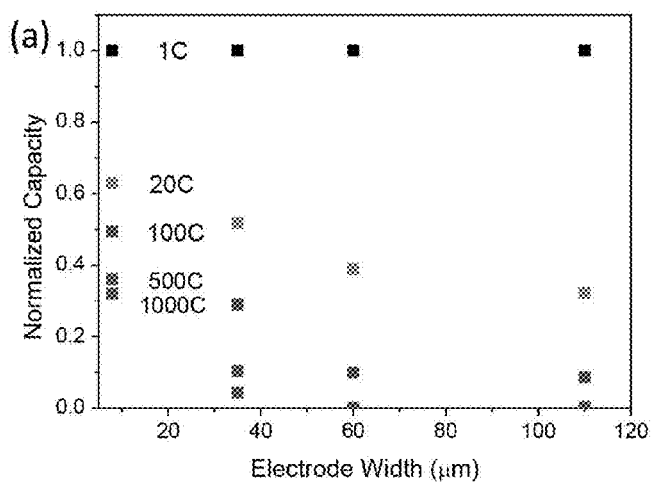
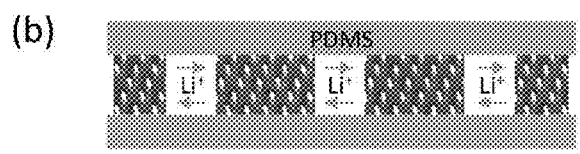
FIGs. 12A and 12B

METHOD OF FABRICATING A THREE-DIMENSIONAL (3D) POROUS ELECTRODE ARCHITECTURE FOR A MICROBATTERY

RELATED APPLICATIONS

The present patent document is a continuation-in-part of U.S. patent application Ser. No. 14/235,338, now U.S. Pat. No. 9,406,938, filed Jan. 27, 2014, which is the U.S. national stage of PCT/US2012/048057, filed Jul. 25, 2012, which claims priority to U.S. Provisional Patent Application Ser. No. 61/513,178, filed on Jul. 29, 2011. All of the foregoing applications are hereby incorporated by reference in their entirety.

TECHNICAL FIELD

This disclosure is related generally to energy storage technology, and more particularly to an improved fabrication method for miniature batteries ("microbatteries").

BACKGROUND

Microelectronics, microsensors, and microelectromechanical systems (MEMS) typically utilize energy sources located off-chip. Integrating microscale energy storage on-chip with microdevices is essential for achieving autonomous devices. Electrical energy for microdevices can be provided by either capacitors or batteries. Capacitors can charge and discharge very quickly, but inherently contain very little energy. Traditional batteries contain large amounts of energy, but cannot charge or discharge quickly. Other power sources, such as fuel cells, are practical for larger systems, but are not easily miniaturized.

Batteries are limited by their maximum power density/discharge rate because of slow kinetics related to ion and electron transport. Reducing the characteristic ion and electron diffusion lengths within the active battery material has proven to be successful in increasing power densities and discharge rates; however, this has also resulted in a substantial decrease in energy density. Miniature batteries have been developed to power $cm^2$ sized devices and microelectronics, but they have not seen widespread adoption due to limits in their energy and power capabilities. Thin-film lithium ion batteries, for example, have high power densities due to thin active material layers (<1 μm), but the total power and energy provided is generally not sufficient to meet the demands of micro devices due to the two-dimensional architecture inherent to thin films. Building into the third dimension—e.g., making thicker active material layers—can boost the energy density; however, electron and ion diffusion lengths concomitantly increase, thereby reducing power density.

3D bicontinuous porous electrodes can enable rapid charge and discharge for lithium ion batteries because of their shortened pathways for both liquid-phase and solid-phase ion diffusions. Recently, this type of porous electrode has been integrated into an interdigitated configuration for microbatteries that can exhibit two times greater energy density and two thousand times greater power density compared to previous structures. Such microbatteries may be realized by independently electroplating anode and cathode active materials on interdigitated 3D porous nickel scaffolds formed from a colloidal template. Although this technology has set a few new records for high power microbatteries, there are several important issues to be addressed. The nickel current collector may grow isotropically instead of vertically during bottom-up deposition, leading to hemispherically shaped electrodes that do not fully utilize the device volume, and thus may not exhibit the maximal energy density. Microbatteries often require tall electrodes (~100 μm) to achieve high areal energy density. If the electrode width increases simultaneously with height during fabrication, the power performance may be degraded and the areal density limited.

BRIEF SUMMARY

An improved method of fabricating a three-dimensional (3D) porous electrode architecture for a microbattery that allows for better control over the size and morphology of the porous electrodes has been developed. Microbatteries prepared using the new method may exhibit excellent power performance and good cyclability at high C rates.

The method comprises forming a microbattery template including (a) a lattice structure comprising a first lattice portion separated from a second lattice portion on a substrate, and (b) a solid structure on the substrate at least partially surrounding the first and second lattice portions. The solid structure includes a separating portion disposed between the first and second lattice portions. Interstices of the first lattice portion are infiltrated with a first conductive material and interstices of the second lattice portion are infiltrated with a second conductive material. Each of the first and second conductive materials fills the interstices to reach a predetermined thickness on the substrate. The lattice structure and the solid structure are removed from the substrate, thereby forming first and second conductive scaffolds from the first and second conductive materials, where the first and second conductive scaffolds have (a) a porosity defined by the lattice structure and (b) a lateral size and shape defined by walls of the solid structure.

BRIEF DESCRIPTION OF THE DRAWINGS

FIGS. 1A-1B show a top view and a perspective view, respectively, of a portion of a three-dimensional (3D) lattice structure and solid structure formed on a substrate to serve as a microbattery template during fabrication of a 3D porous electrode architecture.

FIGS. 11A and 11B show optical images of porous anodes and cathodes sealed by PDMS covers. In order to visualize the contact between the electrodes and PDMS, the top half of the PDMS surface is coated with gold where no pressure is applied to the PDMS in (a) and external pressure is applied to the PDMS in (b) to ensure good contact.

FIG. 12A shows capacity retention of PDMS-covered microbatteries of different electrode widths discharged at various C rates.

FIG. 12B provides a schematic illustration of ion transport in the cells with the PDMS cover.

DETAILED DESCRIPTION

Figure 1C:
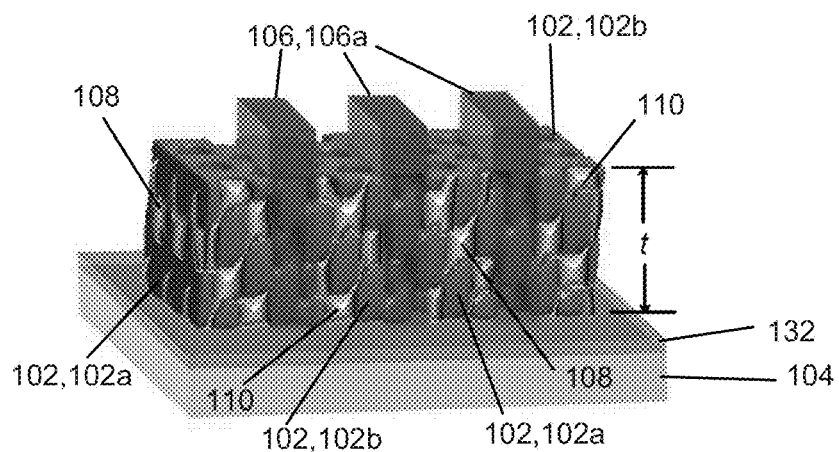
FIG. 1C shows infiltration of the lattice structure (specifically, first and second portions of the lattice structure) with first and second conductive materials, respectively.

FIGS. 1A-1B show a top view and a perspective view, respectively, of a three-dimensional (3D) microbattery template comprising a lattice structure 102 and a solid structure 106 formed on a substrate during fabrication of a 3D porous electrode architecture. (Only a portion of the template shown in FIG. 1A is shown in FIG. 1B.) The new fabrication method allows for better control over the size, shape, porosity and spacing of the resulting 3D porous electrodes, as described below in reference to FIGS. 1A-1E.

Referring first to FIGS. 1A and 1B, the method of fabricating a 3D porous electrode architecture includes forming a microbattery template comprising a lattice structure 102 and a solid structure 106 disposed on a substrate 104. The lattice structure 102 comprises a first lattice portion 102a separated from a second lattice portion 102b on the substrate 104. The solid structure 106 comprises a separating portion 106a between the first and second lattice portions 102a,102b, and at least partially surrounds the first and second lattice portions 102a,102b. As shown in FIG. 1A, the solid structure 106 may surround the first and second lattice portions 102a,102b on all sides.

Each of the first and second lattice portions 102a,102b of the lattice structure 102 may be described as a solid scaffold comprising a network of interconnected interstices or pores extending therethrough. The interconnected interstices or pores may have an ordered (regular) or disordered (random) arrangement. Thus, the lattice structure 102 and first and second lattice portions 102a,102b may be either periodic or aperiodic.

The lattice structure 102 serves as a template to define the porosity of porous electrodes formed during fabrication, as described further below. The solid structure 106 serves as a template to define the lateral size and shape (footprint on the substrate 104) of the porous electrodes, and the separating portion 106a of the solid structure 106 defines the spacing between the porous electrodes.

Referring to FIG. 1C, during fabrication of the porous electrodes, interstices of the first lattice portion 102a are infiltrated with a first conductive material 108 and interstices of the second lattice portion are infiltrated with a second conductive material 110. Each of the first and second conductive materials 108,110 may fill the interstices to reach a predetermined thickness t on the substrate. The lateral extent of the first and second conductive materials 108,110 is limited by the presence of the solid structure 106 surrounding the first and second lattice portions 102a,102b. The first and second conductive materials 108,110 may be different conductive materials or the same conductive material.

Figure 1D:
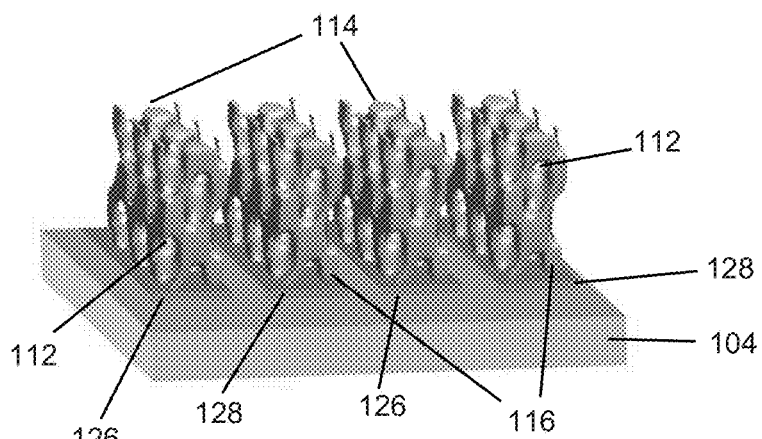
FIG. 1D shows removal of the lattice structure and the solid structure after infiltration of the first and second conductive materials to form first and second conductive scaffolds.

After the infiltration, the microbattery template 100 comprising the solid structure 106 and the lattice structure 102 may be removed from the substrate 104, as shown in FIG. 1D. Removal of the lattice structure 102 leaves a network of interconnected voids 112 in each of the first and second conductive materials 108,110, thus forming first and second conductive scaffolds (or current collectors) 114,116. The first conductive scaffold 114 may be referred to as a "cathode scaffold," and the second conductive scaffold 116 may be referred to as an "anode scaffold." Each conductive scaffold 114,116 has a lateral size and shape defined by the solid structure 106 that has been removed.

Figure 1E:
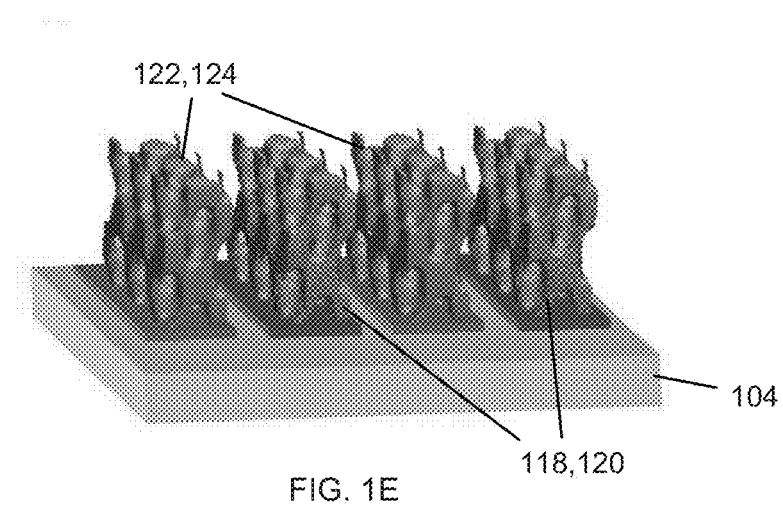
FIG. 1E shows conformal deposition of an anode active material on the second conductive scaffold to form a porous anode and conformal deposition of a cathode active material on the first conductive scaffold to form a porous cathode.

To build a battery structure, an anode active material 118 is conformally deposited on the second conductive scaffold 116 to form a porous anode 120 and a cathode active material 122 is conformally deposited on the first conductive scaffold 114 to form a porous cathode 124, as illustrated in FIG. 1E. The first and second conductive scaffolds 114,116 act as current collectors and may have a nanoscale and/or microscale pore size. The thickness of the active material 118,122 (typically about 20-100 nm) may control the ion diffusion length while the tailorable porosity (typically from about 200 nm to about 2 µm) allows ions to interpenetrate the scaffolds 114,116. Such porous 3D electrodes 120,124 can be employed with most battery chemistries, including but not limited to nickel metal hydride and lithium ion chemistries. Additional details about the fabrication step shown schematically in FIG. 1E may be found in U.S. patent application Ser. No. 14/235,338, which was incorporated by reference above.

The formation and integration of the solid structure 106 with the lattice structure 102 on the substrate 104 to form the microbattery template 100 can be carried out using any of several different processing approaches. The processing approaches are summarized here and then described in greater detail below.

In a first approach, a single type (tone) of photoresist is applied to the substrate and two patterning steps are carried out. One of the patterning steps is a 2D patterning step (utilizing a 2D pattern) that forms the solid structure, and the other is a 3D patterning step (utilizing a 3D pattern) that forms the lattice structure. Each patterning step comprises light exposure followed by development of the photoresist to selectively remove exposed or unexposed photoresist and form the desired pattern. The development may occur after each exposure step or only after both exposure steps have been carried out. The order of the patterning steps may be changed, and the photoresist may be a negative or positive photoresist.

In a second approach, two types (tones) of photoresist are employed in two patterning steps. The first patterning step is either a 2D or a 3D patterning step that creates the solid structure or the lattice structure, respectively. The 3D or 2D patterning step that was not carried out in the first patterning step is carried out in the second patterning step, and the structure not created in the first step (either the lattice structure or the solid structure) is created in the second patterning step. In the first patterning step, a first photoresist is applied to the substrate and patterned by light exposure followed by development of the photoresist to selectively remove exposed or unexposed photoresist. In the second patterning step, a second photoresist of opposite tone to the first photoresist is applied to the substrate and patterned (exposed to light and developed to selectively remove exposed or unexposed photoresist). Thus, if the first photoresist is a positive photoresist, then the second photoresist is a negative photoresist; alternatively, if the second photoresist is a positive photoresist, then the first photoresist is a negative photoresist.

In a third approach, microparticle self-assembly is combined with lithographic patterning to form the lattice structure and the solid structure, respectively. A colloidal solution comprising a plurality of microparticles is applied to the substrate in a first step by any of a number of deposition methods, such as spin-coating, drop-casting, tape-casting or others, and the microparticles assemble to form the lattice structure (e.g., a face centered cubic (FCC) lattice, a disordered lattice, etc.). A photoresist is applied to the substrate and the 2D patterning step is carried out in a second step to form the solid structure. The photoresist may be a negative or positive photoresist.

The 2D patterning step referred to above may comprise exposing the photoresist (which may be referred to as a "first photoresist" or a "second photoresist," e.g., in the second approach) to light directed substantially perpendicular to the substrate and passing through a two-dimensional (2D) mask pattern. This exposure, which may be referred to as the "2D exposure step," creates in the photoresist at least one mask-defined exposed region and at least one mask-defined unexposed region. After the exposure, the photoresist may be developed to selectively remove either (a) the at least one mask-defined exposed region or (b) the at least one mask-defined unexposed region from the substrate and form the solid structure. If the photoresist is a negative photoresist, the mask-defined unexposed regions may be removed. If the photoresist is a positive photoresist, the mask-defined exposed regions may be removed.

The 3D patterning step referred to above may comprise exposing the photoresist (which may be referred to as a "first photoresist" or a "second photoresist," e.g., in the second approach) to a three-dimensional (3D) interference pattern of light comprising areas of constructive interference and destructive interference. The exposure, which may be referred to as the "3D exposure step," creates in the photoresist a plurality of interference-defined exposed regions and a plurality of interference-defined unexposed regions. After exposure, the photoresist may be developed to selectively remove either (a) the plurality of interference-defined exposed regions or (b) the plurality of interference-defined unexposed regions from the substrate and form the lattice structure. If the photoresist is a negative photoresist, the interference-defined unexposed regions may be removed. If the photoresist is a positive photoresist, the interference-defined exposed regions may be removed. The lattice structure may be engineered by interference lithography to serve as a template for porous electrodes that exhibit optimal liquid phase diffusion.

First Approach to Forming the Microbattery Template

In a first example of the first approach, a negative photoresist is applied to the substrate. The 3D exposure step is carried out to create a plurality of interference-defined exposed and unexposed regions in the negative photoresist. Then the 2D exposure step is carried out to create at least one mask-defined exposed region and at least one mask-defined unexposed region in the negative photoresist. After the 3D and 2D exposure steps, the negative photoresist is developed to selectively remove the plurality of interference-defined unexposed regions and the at least one mask-defined unexposed region from the substrate, thereby forming the microbattery template comprising the lattice structure and the solid structure.

In a second example of the first approach, a negative photoresist is applied to the substrate. The 2D exposure step is carried out to create at least one mask-defined exposed region and at least one mask-defined unexposed region in the negative photoresist. Then the 3D exposure step is carried out to create a plurality of interference-defined exposed and unexposed regions in the negative photoresist. After the 2D and 3D exposure steps, the negative photoresist is developed to selectively remove the plurality of interference-defined unexposed regions and the at least one mask-defined unexposed region from the substrate, thereby forming the microbattery template comprising the lattice structure and the solid structure.

In a third example of the first approach, a negative photoresist is applied to the substrate. The 2D exposure step is carried out to create at least one mask-defined exposed region and at least one mask-defined unexposed region in the negative photoresist. The negative photoresist is developed to selectively remove the at least one mask-defined unexposed region from the substrate, thereby forming the solid structure. The negative photoresist is (re)applied to the substrate and to the solid structure. The 3D exposure step is carried out to create a plurality of interference-defined exposed and unexposed regions in the negative photoresist. The negative photoresist is developed to selectively remove the plurality of interference-defined unexposed regions from the substrate, thereby forming the lattice structure.

In a fourth example of the first approach, a negative photoresist is applied to the substrate. The 3D exposure step is carried out to create a plurality of interference-defined exposed and unexposed regions in the negative photoresist. The negative photoresist is developed to selectively remove the plurality of interference-defined unexposed regions from the substrate, thereby forming the lattice structure. The negative photoresist is (re)applied to the substrate and to the lattice structure, which may entail infiltration of the lattice structure with the negative photoresist. The 2D exposure step is carried out to create at least one mask-defined exposed region and at least one mask-defined unexposed region in the negative photoresist. The negative photoresist is developed to selectively remove the plurality of interference-defined unexposed regions from the substrate, thereby forming the solid structure.

Second Approach to Forming the Microbattery Template

In a first example of the second approach, a negative photoresist is applied to the substrate. The 2D exposure step is carried out to create at least one mask-defined exposed region and at least one mask-defined unexposed region in the negative photoresist. The negative photoresist is developed to selectively remove the at least one mask-defined unexposed region from the substrate, thereby forming the solid structure. A positive photoresist is applied to the substrate and to the solid structure. The 3D exposure step is carried out to create a plurality of interference-defined exposed and unexposed regions in the positive photoresist. The positive photoresist is developed to selectively remove the plurality of interference-defined exposed regions from the substrate, thereby forming the lattice structure.

In a second example of the second approach, a negative photoresist is applied to the substrate. The 3D exposure step is carried out to create a plurality of interference-defined exposed and unexposed regions in the negative photoresist. The negative photoresist is developed to selectively remove the plurality of interference-defined unexposed regions from the substrate, thereby forming the lattice structure. A positive photoresist is applied to the substrate and to the lattice structure, which may entail infiltration of the lattice structure with the positive photoresist. The 2D exposure step is carried out to create at least one mask-defined exposed region and at least one mask-defined unexposed region in the positive photoresist. The positive photoresist is developed to selectively remove the at least one mask-defined exposed region from the substrate, thereby forming the solid structure.

In a third example of the second approach, a positive photoresist is applied to the substrate. The 2D exposure step is carried out to create at least one mask-defined exposed region and at least one mask-defined unexposed region in the positive photoresist. The positive photoresist is developed to selectively remove the at least one mask-defined exposed region from the substrate, thereby forming the solid structure. A negative photoresist is applied to the substrate and to the solid structure. The 3D exposure step is carried out to create a plurality of interference-defined exposed and unexposed regions in the negative photoresist. The negative photoresist is developed to selectively remove the plurality of interference-defined unexposed regions from the substrate, thereby forming the lattice structure.

In a fourth example of the second approach, a positive photoresist is applied to the substrate. The 3D exposure step is carried out to create a plurality of interference-defined exposed and unexposed regions in the positive photoresist. The positive photoresist is developed to selectively remove the at least one mask-defined exposed region from the substrate, thereby forming the lattice structure. A negative photoresist is applied to the substrate and to the lattice structure. The 2D exposure step is carried out to create at least one mask-defined exposed region and at least one mask-defined unexposed region in the negative photoresist. The negative photoresist is developed to selectively remove the at least one mask-defined unexposed region from the substrate, thereby forming the solid structure.

Third Approach to Forming the Microbattery Template

In a first example of the third approach, a colloidal solution comprising a plurality of microparticles is applied to the substrate, and the microparticles assemble to form the lattice structure, which, as set forth above, may be periodic or aperiodic. A negative photoresist is applied to the substrate and to the lattice structure. The 2D exposure step is carried out to create at least one mask-defined exposed region and at least one mask-defined unexposed region in the negative photoresist. The negative photoresist is developed to selectively remove the at least one mask-defined unexposed region from the substrate, thereby forming the solid structure.

In a second example of the third approach, a colloidal solution comprising a plurality of microparticles is applied to the substrate, and the microparticles assemble to form the lattice structure. A positive photoresist is applied to the substrate and to the lattice structure. The 2D exposure step is carried out to create at least one mask-defined exposed region and at least one mask-defined unexposed region in the positive photoresist. The positive photoresist is developed to selectively remove the at least one mask-defined exposed region from the substrate, thereby forming the solid structure.

In any of the preceding embodiments, the lattice structure may be formed before the solid structure, or the lattice structure may be formed after the solid structure. In embodiments in which the lattice structure is formed first, the lattice structure may include at least one additional portion besides the first and second lattice portions which are ultimately separated by the separating portion of the solid structure. This is because the lattice structure may be formed initially as a continuous lattice. Alternatively, when the lattice structure is formed second, after the solid structure has been formed, the lattice structure may include only the first and second lattice portions. It is also possible, however, that when the lattice structure is formed second, the lattice structure may include one or more additional lattice portions in addition to the first and second lattice portions.

The predetermined 2D geometry of the solid structure 106 determines the lateral size and shape of (a) the first and second conductive scaffolds 114,116 that are formed by infilling the lattice portions 102a,102b with first and second conductive materials 108,110, and (b) the inverse structures (the porous electrodes 120,124) that are formed when the lattice portions 102a,102b are removed. When viewed from above the substrate 104 (e.g., see FIG. 1A), the solid structure 106 has a predetermined 2D geometry which may be described as being a negative of that of the first lattice portion 102a and the second lattice portion 102b.

Accordingly, the predetermined 2D geometry may be chosen such that each of the first and second conductive scaffolds 114,116 and the porous electrodes 120,124 have a maximum lateral dimension (i.e., length) of from about 5 microns to about 5 cm (or in some cases from about 50 microns and about 500 microns) and a shape and spacing that promote reduced diffusion distances in the resultant battery cell. The length is not fundamentally limited and may depend on the dimensions of the substrate and the electrode geometry. In one example, the porous electrodes 120,124 may define side-by-side rectangular patterns on the substrate 104. In another example, the porous electrodes 120,124 may have an interdigitated relationship such as shown in FIG. 1A for the microbattery template 100, which allows for a reduced average electrode spacing (and potentially an increased power output). The width of the porous electrodes 120,124 or porous electrode digits may be from about 5 microns to about 500 microns, or from about 10 microns to about 100 microns, and the spacing between the porous electrodes 120,124 may be from about 1 micron to about 100 microns, or from about 5 microns to about 50 microns.

As discussed above, after formation of the lattice structure 102 and solid structure 106, interstices of the first and second lattice portions 102a,102b are infiltrated with a first conductive material 108 and a second conductive material 110, as shown schematically in FIG. 1C. Infiltration of the first and second conductive materials 108,110 may be carried out by electrodeposition using first and second conductive patterns 126,128 underlying the first and second lattice portions 102a,102b on the substrate 104. Alternative methods of depositing the first and second conductive 108,110 materials are discussed below.

To form the first and second conductive patterns 126,128 used in the electrodeposition process, an electrically conductive coating 132 may be deposited on the substrate 104 prior to forming the microbattery template 100 comprising the lattice structure 102 and the solid structure 106. The electrically conductive coating 132 may then be patterned using techniques known in the art to form the first and second conductive patterns 126,128, which are electrically isolated from each other. Although the electrically conductive coating 132 is deposited on the substrate 104 prior to forming the lattice structure 102 and the solid structure 106, the first and second conductive patterns 126,128 may be formed before or after the lattice structure 102 and the solid structure 106 are formed.

In the exemplary process of FIGS. 1A-1E, the first and second conductive patterns 126,128 are formed after the lattice structure 102 and the solid structure 106 are formed (see FIGS. 1C and 1D).

In an alternative embodiment shown in FIGS. 2A-2E, the first and second conductive patterns 226,228 are formed prior to formation of the lattice structure 202 and the solid structure 206. Consequently, if the substrate 204 comprises an optically transparent material, the first and second conductive patterns 226,228 may function as the two-dimensional mask pattern for formation of the solid structure 206.

Figure 2A:
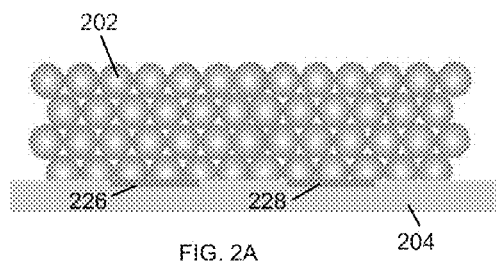
FIGS. 2A-2E show an exemplary process to form a 3D porous electrode architecture that includes forming first and second conductive patterns on a substrate prior to forming the lattice structure and solid structure; the conductive patterns serve as a two-dimensional mask for formation of the solid structure and then as an electrode for electrodeposition of the first and second conductive materials.
Figure 2B:
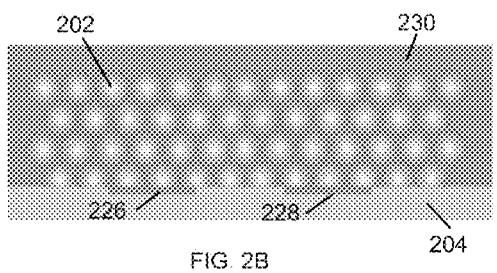
Figure 2C:
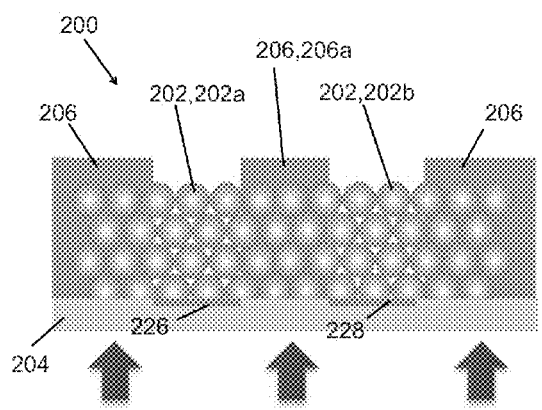
Figure 2D:
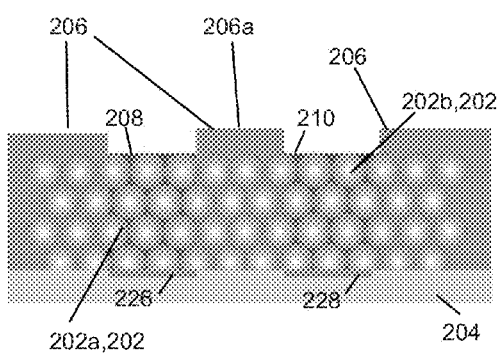
Figure 2E:
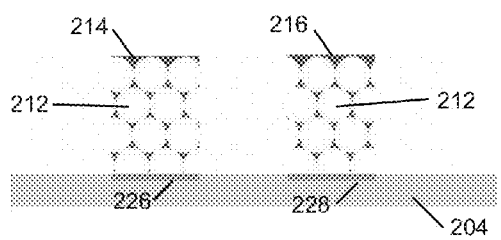

FIG. 2A shows an exemplary lattice structure 202 formed on an optically transparent substrate (e.g., glass) 204 that includes first and second conductive patterns 226,228 formed thereon. A negative photoresist 230 is applied to the substrate 204 and to the lattice structure 202 such that the lattice structure 202 is infiltrated with the photoresist 230, as shown in FIG. 2B. A 2D exposure step is carried out from under (behind) the transparent substrate 204 to create at least one mask-defined exposed region and at least one mask-defined unexposed region in the photoresist 230, and then the photoresist 230 is developed to selectively remove the at least one mask-defined unexposed region from the substrate 204. Thus, the solid structure 206 shown in FIG. 2C is formed, which includes a separating portion 206a separating the first and second lattice portions 202a,202b, and the microbattery template 200 is defined. FIG. 2D shows infiltration of the first and second lattice portions 202a,202b with the first and second conductive materials 208,210, which may be the same or different materials. The infiltration may be carried out using electrodeposition. As shown in FIG. 2E, the lattice structure 202 and the solid structure 206 may then be removed as described above. Thus, first and second conductive scaffolds 214,216 including a network of interconnected voids 212 extending therethrough are formed.

Although FIG. 2A shows a lattice structure 202 comprising an assembly of microparticles, the lattice structure 202 is not limited to this exemplary embodiment and may be formed as described above using a 3D patterning step according to any of the embodiments.

It is possible to engineer a high level of adhesion between the conductive scaffold and the underlying conductive pattern to allow the conductive scaffold (or porous electrode) to be lifted off the original substrate along with the underlying pattern and transferred to a different substrate. For example, if nickel is used as one or both of the first and second conductive materials, and indium-tin oxide (ITO) is used for one or both of the first and second conductive patterns, an oxidation treatment of the ITO prior to electrodepositing the nickel leads to enhanced adhesion between the two, as discussed further in the examples below.

Alternatively, first and second conductive patterns may not be formed on the substrate (either before or after formation of the lattice structure and the solid structure). In this case, a deposition route other than electrodeposition may be employed to deposit the first and second conductive materials. For example, chemical vapor deposition (CVD), physical vapor deposition (PVD), atomic layer deposition (ALD), sol-gel or another technique may be used for infiltration of the conductive material(s). FIGS. 3A-3F show a series of exemplary process steps in which a deposition process other than electrodeposition is used to form the first and second conductive materials. As mentioned above, the first and second conductive materials may be the same or different conductive materials.

Figure 3A:
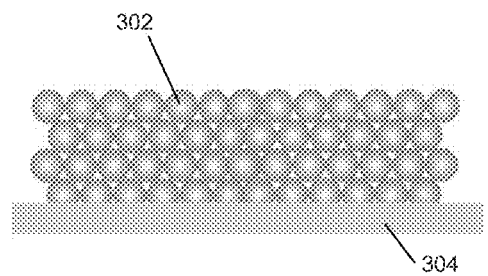
FIGS. 3A-3F show an exemplary process to form a 3D porous electrode architecture in which a deposition method other than electrodeposition is employed to deposit the first and second conductive materials.
Figure 3B:
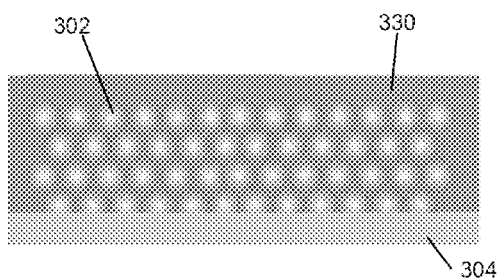
Figure 3C:
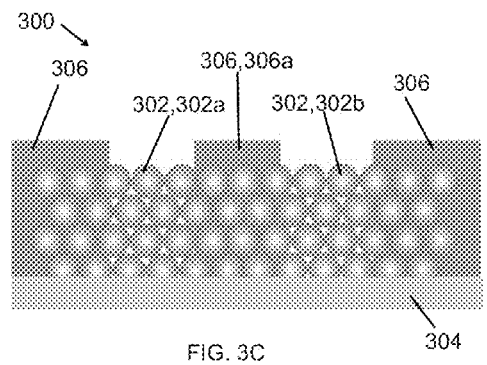
Figure 3D:
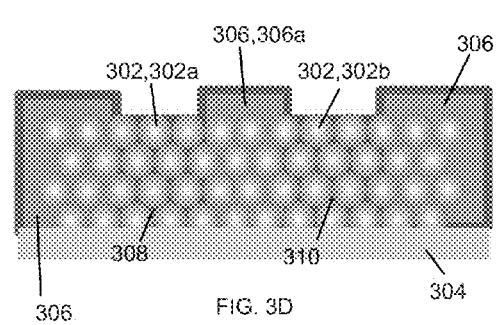
Figure 3E:
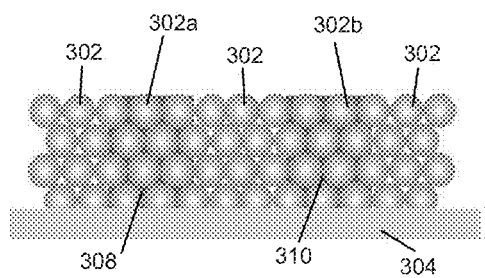
Figure 3F:
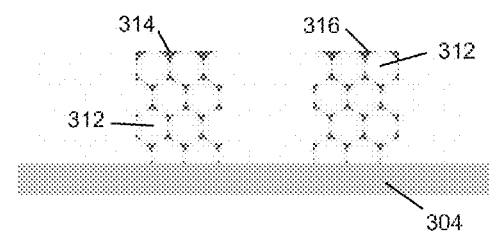

FIG. 3A shows an exemplary lattice structure 302 formed on substrate 304. A photoresist (positive or negative) 330 is applied to the substrate 304 and to the lattice structure 302 such that the lattice structure 302 is infiltrated with the photoresist, as shown in FIG. 3B. A 2D exposure step is carried out to create at least one mask-defined exposed region and at least one mask-defined unexposed region in the photoresist 330, and then the photoresist 330 is developed to selectively remove the at least one mask-defined unexposed (or exposed) region from the substrate 304. Thus, the solid structure 306 shown in FIG. 3C, which includes a separating portion 306a separating the first and second lattice portions 302a,302b, is formed, and the microbattery template 300 is created. Deposition of the first and second conductive materials 308,310 is illustrated in FIG. 3D, where the materials 308,310 (which may be the same or different materials) coat and infiltrate the first and second lattice portions 302a,302b. Because the deposition may be a blanket process, the solid structure 306 may also be coated with the first and second conductive materials 308,310. Once deposition is complete, excess conductive material may be removed by dry etching or a lift-off process, as known in the art. After deposition/infiltration and etching/lift-off, the solid structure 206 may be removed, as shown in FIG. 3E. The lattice structure 302 may also be removed to form voids 312 in each of the first and second conductive materials 308,310, thereby forming 3D first and second conductive scaffolds 314,316, as shown in FIG. 3F.

Although FIG. 3A shows a lattice structure 302 comprising an assembly of microparticles, the lattice structure 302 is not limited to this exemplary embodiment and may be formed as described above using a 3D patterning step according to any of the embodiments. Additionally, the photoresist 330 employed to form the solid structure 306, as shown in FIG. 3C, may be either a positive or a negative photoresist 330.

In some embodiments, the substrate may comprise an antireflection coating deposited thereon.

If desired, the size of the voids in the first and second conductive scaffolds may be increased after removal of the microparticles. Chemical etching, electropolishing (electrochemical etching), or anodization followed by chemical etching may be used to enlarge the void size and thereby increase the volume fraction of porosity of one or both conductive scaffolds. For example, a conductive scaffold formed from a close packed lattice structure may have a porosity of 74%; this can be increased to 75% or larger (e.g., from about 75% to about 99% porosity) by electrochemical etching.

Also or alternatively, interconnections between the microparticles of the lattice structure may be enlarged prior to depositing the conductive material(s) and removing the lattice structure, thereby enhancing the interconnected porosity of the resulting conductive scaffold, as described in U.S. patent application Ser. No. 13/467,419, "Method of Enhancing the Connectivity of a Colloidal Template, and a Highly Interconnected Porous Structure," filed on May 9, 2012, which is hereby incorporated by reference in its entirety.

The first and second conductive scaffolds may comprise one or more electrically conductive materials selected from the group consisting of: C, Co, Cr, Cu, Ag, Au, W, Mn, Mo, Zn, Ni, Pt, Re, Sn, Ti, Ta, Al, Si, N and Fe. For example, the electrically conductive materials may be metals or alloys. Exemplary positive photoresists may be selected from among: polymethyl methacrylate (PMMA), AZ 9200-series photoresists, Microposit® S1800 series photoresists, Megaposit™ SPR™ 220 series photoresists, and ma-P 1200 series photoresists. Exemplary negative photoresists may be selected from among: SU-8 2000 series photoresists, SU-8 3000 series photoresists, AZ® nLOF 2000 series photoresists, AZ® 15 nXT series photoresists, and AZ® 125 nXT series photoresists.

After formation and optional etching of the first and second conductive scaffolds, a layer of an electrochemically active material may be conformally deposited on each scaffold to define a porous cathode and a porous anode for the microbattery cell, as mentioned above. Conformal deposition of the active material (or other material) refers to substantially complete coverage of all exposed surfaces of the underlying conductive scaffold (or other underlying substrate) by the active material (or the other material). This may be achieved by electrodeposition using the respective conductive scaffold as an electrode. Alternatively, another deposition method known in the art, such as chemical vapor deposition (CVD), sol-gel, or atomic layer deposition (ALD), may be used to conformally deposit the active materials.

In the case of a Li-ion battery, a typical cathode active material is MnOOH and a typical anode active material is a Ni—Sn alloy, although other active materials may be employed, and the method is not limited to Li-ion battery chemistries. For example, suitable anode active materials may include lithium, carbon (e.g., graphite, graphene, carbon black, carbon nanotubes) silicon, iron oxide, copper oxide, tin, tin oxide, nickel, nickel oxide, nickel phosphide, titanium oxide, zinc, aluminum, lithium, and/or a copper-tin alloy, and suitable cathode active materials may include materials based on cobalt oxide, lithium iron phosphate, manganese oxide, manganese dioxide, nickel oxyhydroxide, copper (II) oxide, mixed metal oxides and/or vanadium oxide.

As discussed in detail in PCT Patent Application No. PCT/US2012/048057, "Three-Dimensional (3D) Porous Electrode Architecture for a Microbattery," filed Jul. 25, 2012 and incorporated by reference above, the order in which the active materials are deposited—that is, whether the cathode active material is deposited on the first conductive scaffold before the anode active material is deposited on the second conductive scaffold, or vice versa—may be important due to the close proximity of the conductive scaffolds and the vastly different electrode chemistries involved. Additional details about the porous electrode fabrication process may be found in PCT Patent Application No. PCT/US2011/020301, "Three-Dimensional (3D) Porous Device and Method of Making a 3D Porous Device," filed Jan. 6, 2011, and in U.S. Patent Application Publication 2010/0068623, "Porous Battery Electrode for a Rechargeable Battery and Method of Making the Battery Electrode," filed Oct. 7, 2009, which are hereby incorporated by reference in their entirety.

Experimental Example 1

Microbattery Assembly 1.1 Fabrication of Microbattery Templates

Figures 4A, 4B, 4C:
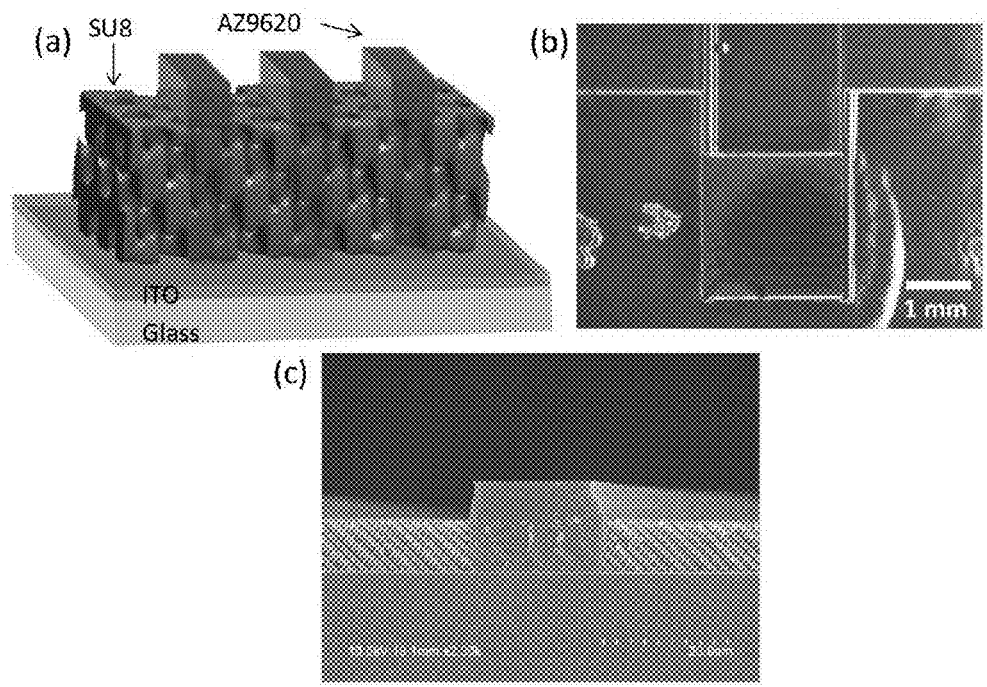
FIGS. 4A-4C show a schematic, optical image and scanning electron microscope (SEM) image of an exemplary battery template prepared using SU-8 resist for the lattice structure and AZ 9260 resist for the solid structure.

SU-8 (negative) resist is used to fabricate thick uniform 3D lattice structures, which are subsequently infiltrated with AZ 9260 to create the solid structure and form the microbattery template. The 3D SU-8 lattice structure is created on ITO glass by 4-beam interference lithography. The ITO glass (ITO thickness: 40 nm) has low reflection and absorption at the laser wavelength (532 nm), and also allows inversion of the photoresist lattice structure to nickel by electrodeposition. After infiltrating the SU-8 lattice structure with positive photoresist AZ 9260, the solid structure is defined photolithographically, as illustrated in FIG. 4A. FIG. 4B is an optical image of the resulting battery template, which has a total area of 4 mm². The width of the individual features of the solid structure and the gaps between them are 35 μm and 15 μm, respectively, in this example. The SEM image of FIG. 4C shows a cross-sectional view of an exemplary battery template, where the straight positive walls of the solid structure formed from the positive photoresist can restrict the Ni to grow substantially vertically in the next step.

1.2 Electrodeposition of Current Collectors and Active Materials

Ni can be readily electroplated on indium-tin oxide (ITO) substrates with resistances ranging from a few ohms to a few kilo-ohms. However, the deposited Ni film often delaminates after reaching a few microns in thickness due to poor adhesion between nickel and the oxide. To address this problem, the ITO substrate is electrochemically oxidized at 2.98 V versus a platinum counter electrode for 5 s in 0.01 M $Na_2SO_4$ and 0.1 M $H_2SO_4$ solution. After the surface treatment, a thin dark layer appears on the ITO surface, allowing Ni to grow up to a few hundred microns on the oxidized ITO without adhesion failure. One possible explanation for the significant adhesion improvement is that Ni forms strong chemical bonds with indium and tin via the introduced oxygen atoms after the oxidization treatment, but is merely absorbed onto the oxide surface by Van der Waals forces without it.

Figures 5A, 5B, 5C:
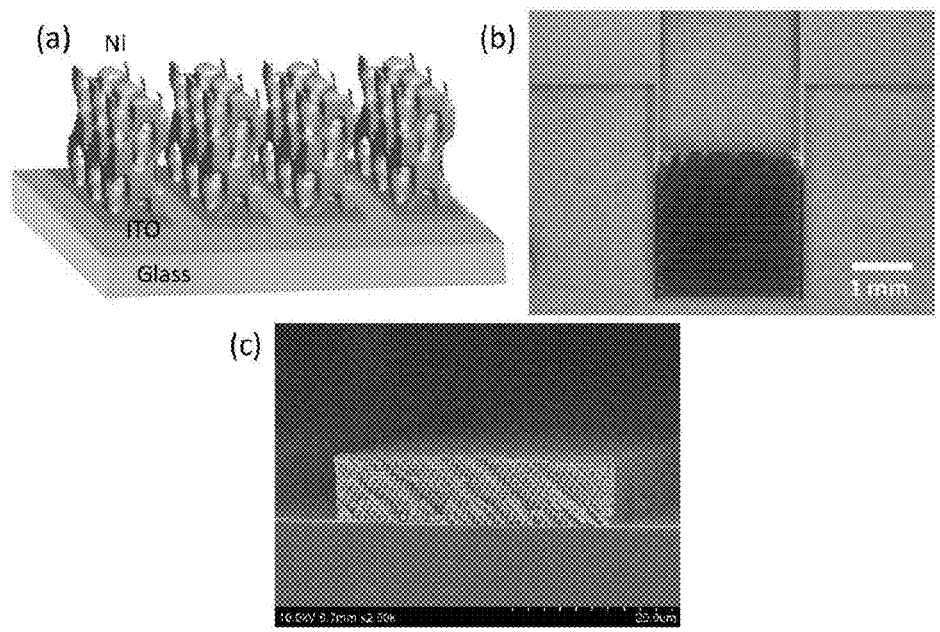
FIGS. 5A-5C show a schematic, optical image and SEM image of first and second conductive scaffolds (or current collectors).

After Ni inversion (i.e., after deposition and infiltration of the SU-8 lattice structure with nickel), the AZ 9260 resist is dissolved in acetone followed by SU-8 resist removal with reactive ion etching. A suitable RIE condition is: 500 mTorr, 200 W, 20 SCCM $O_2$, 2 SCCM $CF_4$, 60 min, which reveals ~10 μm thick interdigitated conductive (Ni) scaffolds (or current collectors). The exposed ITO conductive layer between the conductive scaffolds is then etched using RIE (condition: 30 mTorr, 30 W, 22 SCCM methane, 45 SCCM $H_2$, 12 min), to electrically insulate the anode and cathode current collectors. FIGS. 5A and 5B show a schematic and an optical image, respectively, of interdigitated Ni current collectors. Due to the vertical photoresist walls, the individual electrode "fingers" or digits possess a prismatic shape, and also the resulting width is independent of the height (or thickness), as shown in FIG. 5C.

Figures 6A, 6B, 6C, 6D:
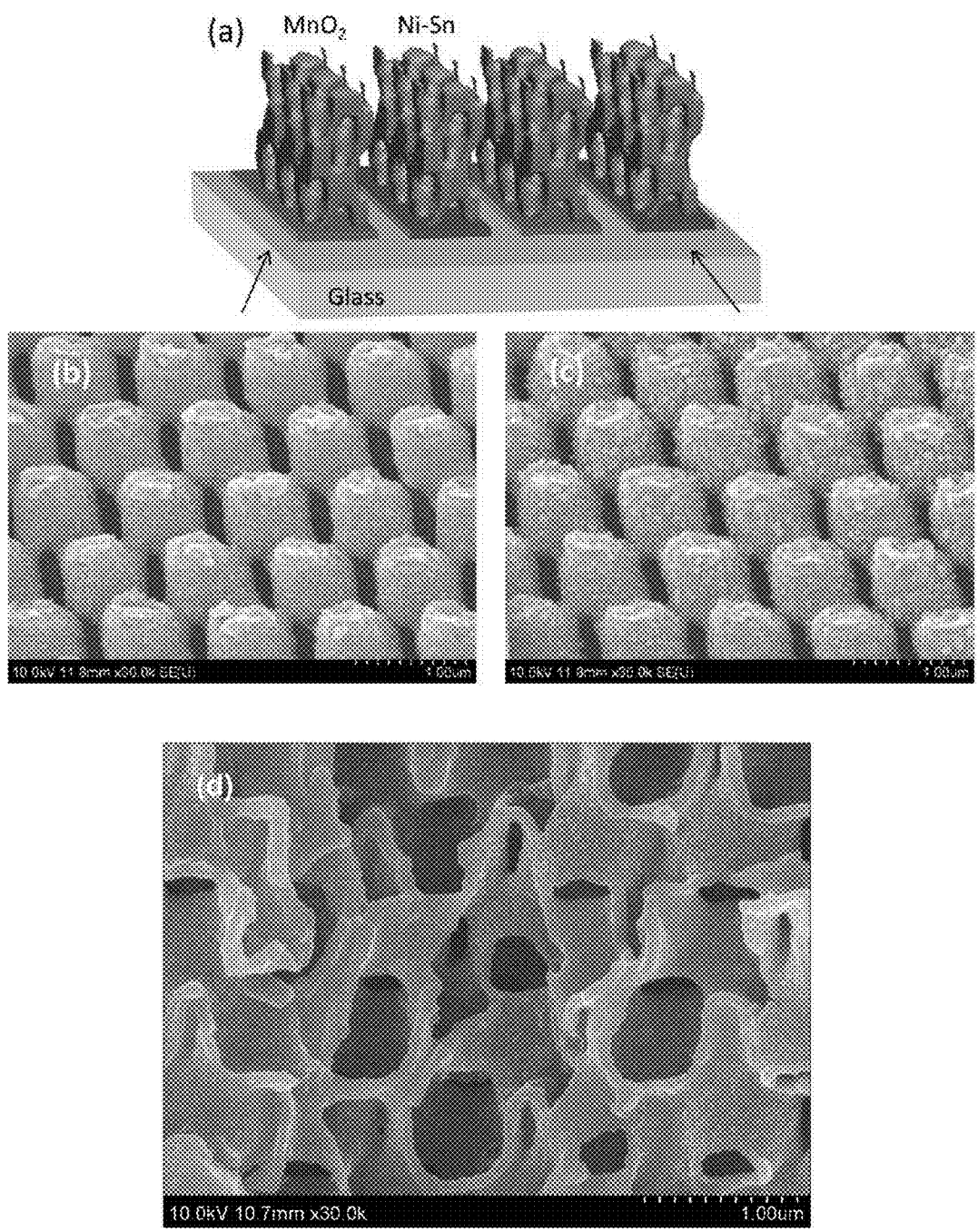
FIGS. 6A-6C show a schematic and SEM images of porous cathodes and anodes comprising a conformal coating of $MnO_2$ (cathodes) and Ni—Sn (anodes).
FIG. 6D shows an SEM image of a $MnO_2$ layer conformally coated onto a nickel scaffold.

As shown in FIG. 6A, Ni—Sn and $MnO_2$ may be sequentially electroplated onto the anode and cathode scaffolds to form a porous anode and cathode, respectively. The electrodeposition methods follow procedures known in the art except that the pulsed voltage routine is modified to be 0.2 s on and 10 s off, to ensure conformal coating through the entire 3D porous anode and cathode structures. FIG. 6B (6C) shows a micrograph of a cross-section of an approximately 100 nm thick $MnO_2$ (Ni—Sn) film conformally coated on a Ni scaffold after 15 cycles of pulsed depositions. The sample is then immersed in LiOH and $LiNO_3$ molten salts at 300° C. for 30 min to lithiate the $MnO_2$. Finally, the cathode and anode are independently charged to 3.8 V and 0.01 V versus lithium metal at 0.5 C, respectively. The electrolyte is a 1:1 ethylene carbonate:dimethyl carbonate and 1 M $LiClO_4$. Finally, the microbattery is capped with a PDMS cover.

Experimental Example 2

Electrochemical Testing of Microbatteries

Battery testing is carried out by galvanostatically charging and discharging the cell between 3.2 V and 1.4 V at various C rates. 1 C stands for charging/discharging the battery in an hour. At a C rate of N, the cell is charged/discharged at N times the 1 C current.

2.1 Improving Microbattery Cycle Life

Figure 7:
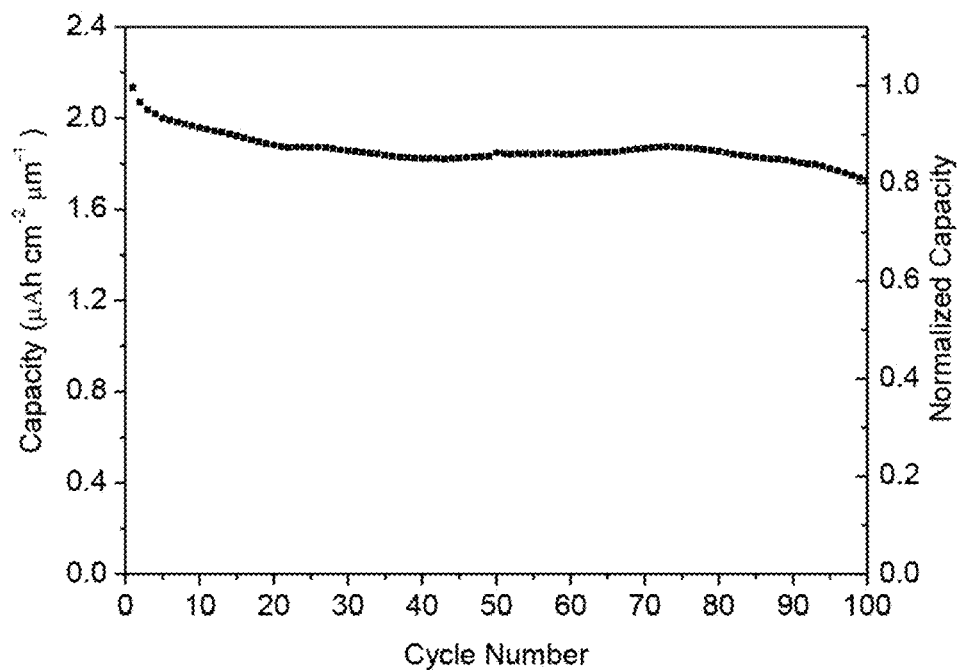
FIG. 7 shows capacity retention of a microbattery for the first 100 cycles. The charge and discharge rates are about 2 C.

Recently, the half-cell cyclabilities of $MnO_2$ and Ni—Sn on 3D Ni scaffolds have been independently studied. The $MnO_2$ porous cathode generally exhibits a good cycle life as its capacity gradually fades to 90% after 50 cycles. However, the capacity of the Ni—Sn porous anode often drops to 90% within the first 5 cycles and then maintains a steady decrease. The large capacity loss in the beginning is believed to be caused by the formation of a solid electrolyte interphase (SEI) layer. This layer comprises inorganic and organic products of the electrolyte decomposition at the negative electrode. Once formed, the SEI layer can prevent further electrolyte reduction during the cycling by blocking the electron transport while only allowing Li ions to travel through. In the present microbatteries, where the nanoporous electrodes inherently have a large surface area, the initial SEI formation can significantly degrade the limited electrolyte, leading to a great lithium-ion loss in the battery. Thus, it is advantageous to produce the SEI layer at the anode before assembling the full cell. In this work, the Ni—Sn electrode is cycled separately for 6 times before the full cell tests. FIG. 7 shows the improved cyclability of such a microbattery, where the cell exhibits ~80% retained capacity after cycling for 100 times at 2 C.

2.2 Power Performance of the Microbattery

Figure 8:
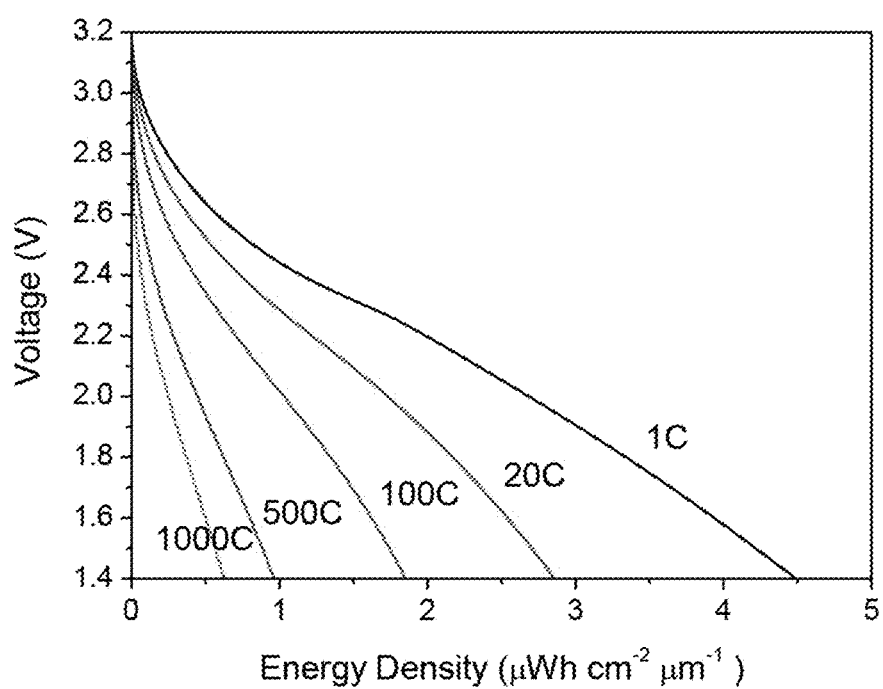
FIG. 8 shows galvanostatic discharge of a microbattery at various C rates, where the width of the electrode is 35 microns and the microbattery is covered by PDMS.
Figure 9:
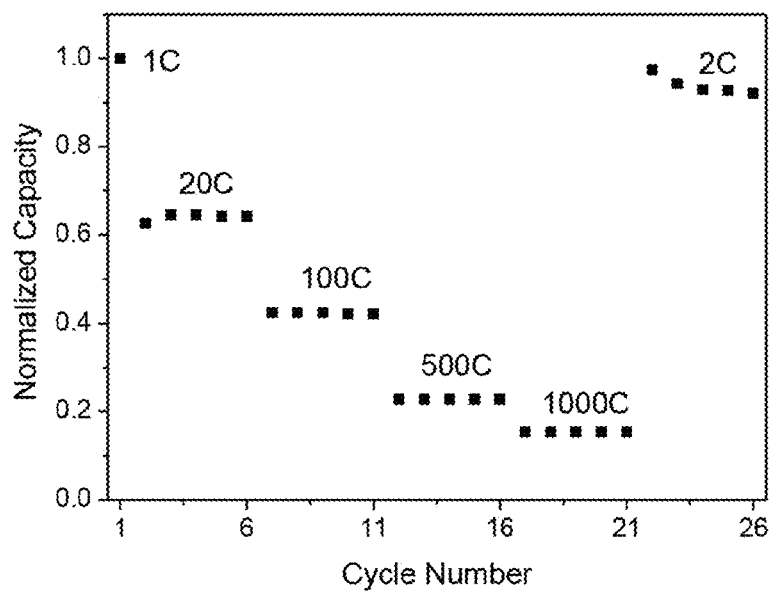
FIG. 9 shows capacity retention of the microbattery cycled for 5 times at each C rate, where the capacity of the cell at high C rates is normalized to the 1 C discharge.

To study the power performance, a microbattery cell that includes 35 μm wide electrode fingers and a PDMS cover is charged at 2 C and discharged at various C rates. FIG. 8 shows the discharge curves at those currents. At 1 C, the battery exhibits a volumetric energy density of 4.5 μWh $cm^{-2}$ $μm^{-1}$. At 1000 C, it delivers 0.6 μWh $cm^{-2}$ $μm^{-1}$ (energy density) and a 3.6 mW $cm^{-2}$ $μm^{-1}$ (power density). The capacity retention of this microbattery versus C rates is presented in FIG. 9, where the capacity was normalized to a 1 C discharge. The cell exhibits excellent power performance and cyclability at high C rates. Nearly 20% of the capacity is extracted from the battery at 1000 C. As will be discussed below, the capacity retention at high C rates is closely related to the gap between the battery and the PDMS cover, as it governs the effective ion pathways in the electrolyte. After being cycled for 5 times at each high C rate, the battery shows only a small capacity loss (FIG. 9).

2.3 Tuning Electrode Digit Width

Figures 10A, 10B:
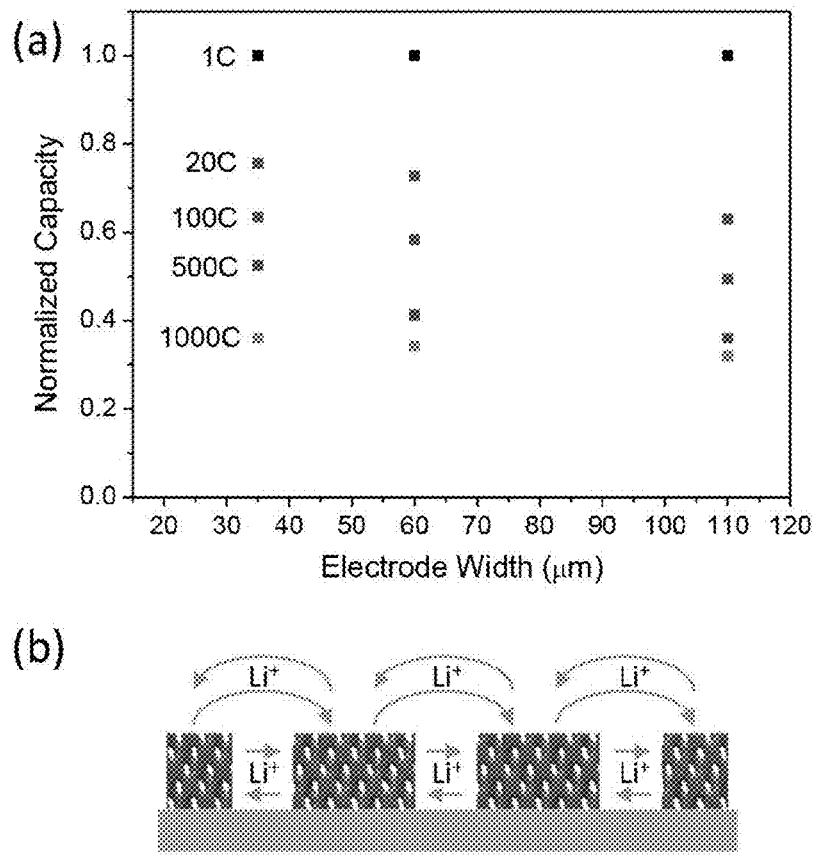
FIG. 10A shows capacity retention of uncovered microbatteries with different electrode widths discharged at various C rates.
FIG. 10B provides a schematic illustration of ion transport in the cells without the PDMS cover.

The desired height for a microbattery may be on the order of about 100 μm to achieve high areal energy density. Recent advances in photolithography techniques have enabled photoresist features with aspect ratios greater than 15, producing structures of a few hundred microns tall and a few microns wide. In principle, the electrode spacing should be small such that the microbattery volume is efficiently utilized. To simulate a practical microbattery, the electrode spacing is maintained at 15 μm and the electrode digit width is varied to investigate the ion transport in 3D porous electrodes. FIG. 10A shows the discharge capacity retention of cells with 35 μm, 60 μm and 110 μm wide electrodes, but without PDMS covers. Although increasing the electrode width can lead to a longer ion diffusion pathway inside the electrodes, all three cells are found to have similar and exceptionally high capacity retention. For example, the fraction of the retained capacity at 1000 C is nearly 40% for all of them. The reason for this observation is illustrated in FIG. 10B. When the batteries are not capped and have a thickness around 8 μm, ions primarily travel in the free space above the cells other than the lateral directions during discharge, as the total diffusion pathway is shorter in the former case. The battery electrodes in a commercial product are generally tall (>100 μm) and fully packaged. Because there is little excess electrolyte above the electrodes, ions are forced to diffuse in the lateral directions.

To simulate this case, the battery (8 μm tall) is capped with PDMS slabs to make the ions travel laterally. FIG. 11A shows an optical image of such covered battery electrodes immersed in electrolyte. Half of the PDMS is coated with gold in order to visualize the interface between the PDMS cover and the electrode. Under a 50X objective, the gap between the PDMS and the electrode is estimated to be about 5 μm, which, however, can still guide the majority of ions to travel in this channel. FIG. 11B shows the same sample configuration but with an external pressure applied to the PDMS. The slightly curved interface suggests a tight contact between the PDMS and the electrode. The tests in FIG. 12 are performed on the cells that are packaged in this manner. The data from the cell with a 110 μm electrode width in FIG. 10A are also plotted here, which can be used to assess the performance of a microbattery with 8 μm wide electrodes, given the nature of the ion diffusion in that cell. When raising the electrode width, the retained capacity at a constant discharge rate is observed to decrease significantly due to the increased diffusion length in electrodes. At 1000 C, only 3% of the capacity is extracted from the cell with 35 μm wide electrodes, while in the previous uncapped cells nearly 40% of capacity is available as ions shuttle in a shorter diffusion pathway.

2.4 Tuning the Electrode Porosity

Figure 13:
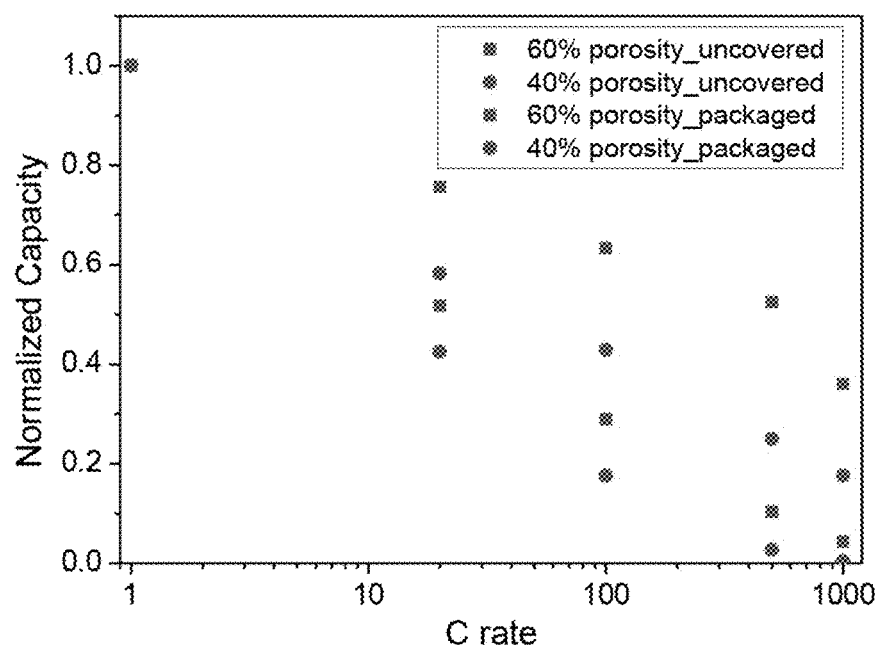
FIG. 13 shows capacity retention of microbatteries having different porosities tested without PDMS covers.

The ion diffusion in the electrolyte phase also depends on the porosity and tortuosity of the electrode following $D=D_0\epsilon/\tau$, where $\epsilon$ and $\tau$ stand for porosity and tortuosity, respectively. Since the porous electrodes can be considered to be the inverse or negative of the microbattery template (the lattice structure and solid structure formed from photoresist), it is possible to control the electrode porosity via exposure conditions during 3D holographic lithography. Two microbatteries (height: 8 μm and electrode width: 35 μm) with about 40% and about 60% pore volume are fabricated by changing the exposure dose during the holographic lithography. FIG. 13 shows the power performance of the microbatteries. Because electrodes with larger porosity can offer shorter diffusion pathways in all directions, the 60% porous battery retains more capacity at high C rates in both covered and uncovered situations.

2.5 Optimization of Electrode Width

Figure 14:
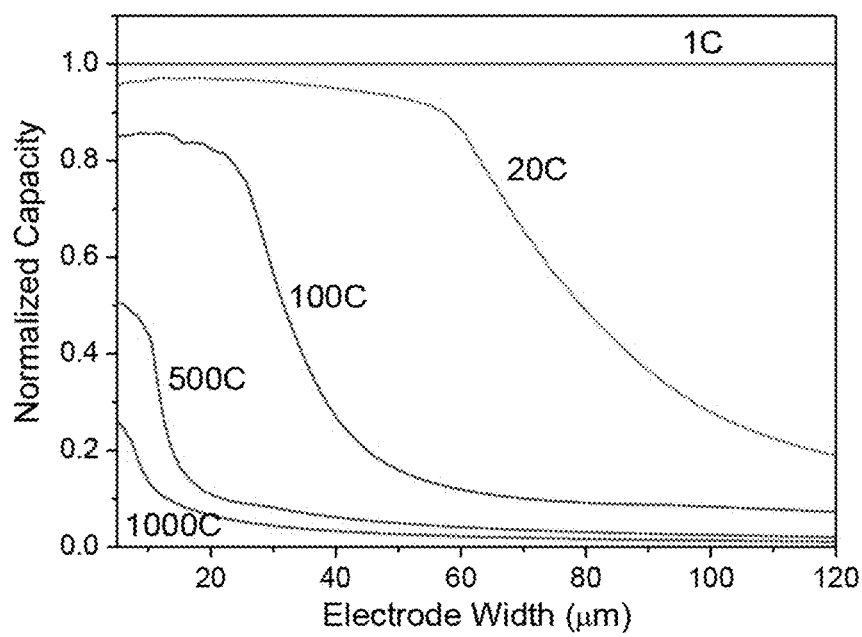
FIG. 14 shows simulated capacity retention for cells with different electrode widths at various discharge rates.
Figures 15A, 15B:
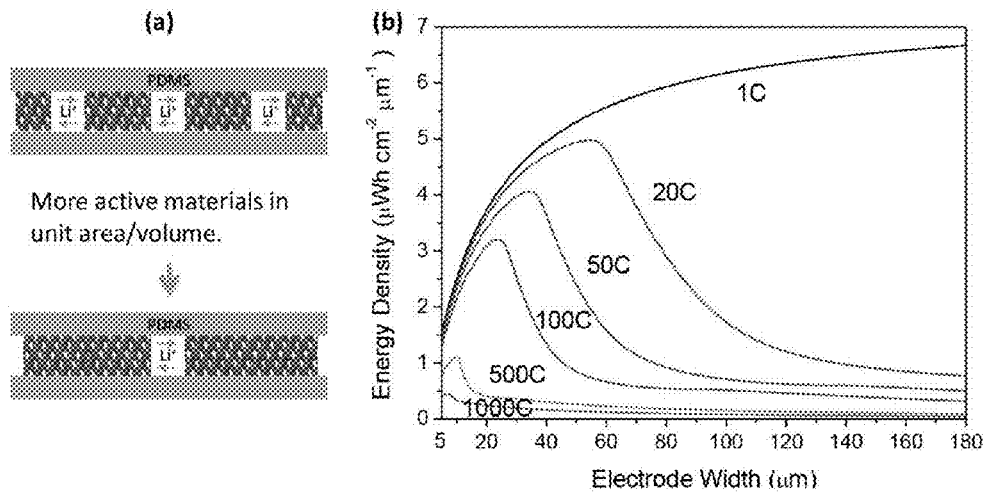
FIG. 15A shows a schematic illustration that the areal/volumetric energy density increases when raising electrode width.
FIG. 15B shows simulated energy density for cells with different electrode widths.
Figures 16A, 16B, 16C, 16D:
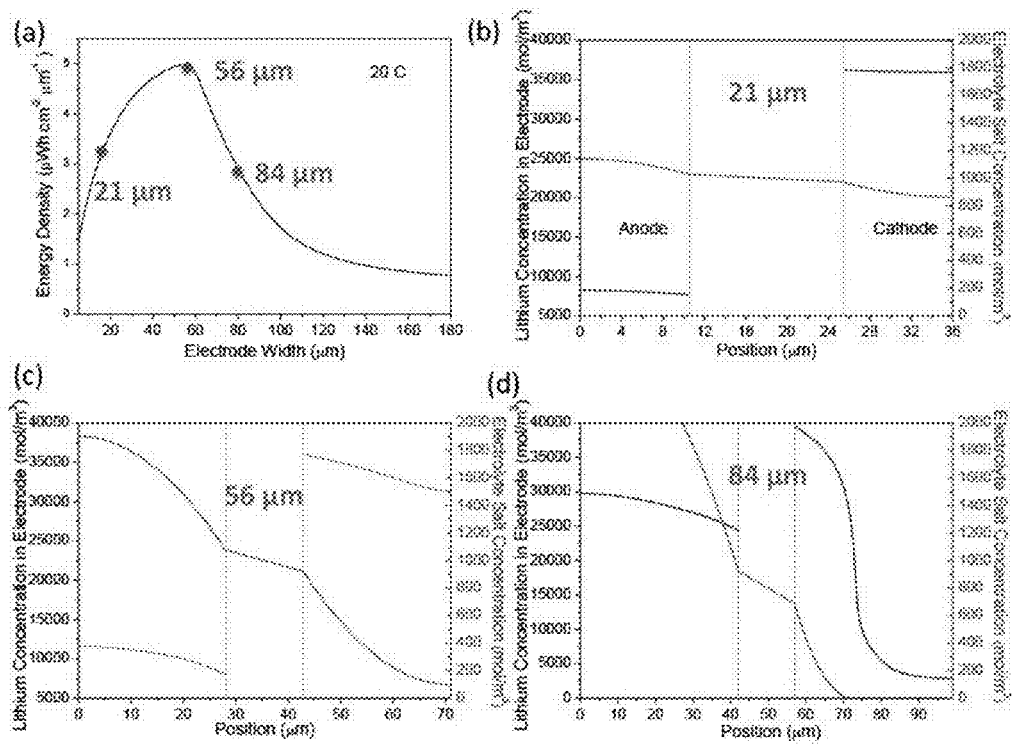
FIGS. 16A-16D show calculated energy density as a function of electrode width at a 20 C discharge rate. The lithium concentration in electrode and the salt concentration in electrolyte are calculated for cells with various electrode widths, including (b) 21 microns; (c) 56 microns; and (d) 84 microns.

The influence of the porous electrode digit width on the battery performance is studied using simulations. A simple isothermal model for lithium ion batteries is employed based on an assumption that ionic charges in the PDMS-capped batteries travel in only one dimension. The modeling is carried out using COMSOL which is well-known for its strength at solving complex differential equations using finite element analysis. The capacity retention is simulated at various discharge rates for microbatteries of different electrode widths and presented in FIG. 14. The capacity at high C rates is normalized to that of 1 C, where the cell is considered to undergo a quasi-equilibrium discharge, as all the capacity of the battery can be extracted at such rate. There exists a critical dimension for the electrode width in each C rate curve, below which the retained capacity changes only slightly versus electrode width, indicating that these batteries have been discharged to a similar state of charge. However, above this value, the capacity dramatically decreases when the electrode width increases. This critical length is believed to be closely related to the ion diffusion length in the liquid phase. Compared to the experimental data in FIG. 12A, the simulation follows the same trend that the high-rate capacity retention generally becomes worse with wider electrodes, though they only have a good agreement at high discharge rates. When the electrodes are very narrow, the cells experience less resistance from ion diffusion in electrolyte. In extreme cases, e.g. at the intercept points in FIG. 14, the capacity retention reaches a maximum and the battery is limited only by solid-state ion diffusion. For interdigitated microbatteries that have a fixed footprint or volume, cells with wider electrodes can provide a larger energy density. This is because the number of gaps between the electrodes (FIG. 15A) is reduced, even if a smaller fraction of the total energy is discharged. The simulated energy density is plotted for cells with different electrodes at various discharge rates in FIG. 15B (the curve is normalized to the energy density measured experimentally from the cell with 35 μm wide electrodes). For 1 C discharge, the cell can release all the energy, and therefore the energy density grows monotonically as the electrode gets wider, obeying W/(W+G), where W and G are the electrode width and the spacing between them, respectively. At high C rates, the energy density initially increases but reaches the peak at some critical length. The lithium concentration profile in the electrodes and the salt concentration profile in the electrolyte are simulated for cells with 21 μm, 56 μm and 84 μm wide electrodes at the end of a 20 C discharge. These three electrode widths correspond to three different regimes, as shown in FIGS. 16A-16D. For W=21 μm, the electrolyte is only slightly polarized and the lithium concentration reaches the maximum in the positive electrode and the minimum in the negative electrode at the end of discharge. Thus, the cell can be fully discharged when W<56 μm. At W=56 μm, there is a large gradient in the lithium salt concentration across the cell and the concentration drops to nearly zero at the center of the positive electrode. However, in this cell, ion diffusion is still sufficient to deliver charges through the entire electrodes so that a complete lithiation is achieved in the cathode. When W=84 μm, the salt is completely depleted at the position X>70 μm as lithium ions are not able to travel this far in the electrode during discharging, which ends the electrochemical processes prematurely and extracts only 40% of the total capacity.

Although the present invention has been described with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of fabricating a three-dimensional (3D) porous electrode architecture for a microbattery, the method comprising:
    forming a microbattery template comprising:
        a lattice structure comprising a first lattice portion separated from a second lattice portion on a substrate; and
        a solid structure on the substrate at least partly surrounding the first and second lattice portions, the solid structure comprising a separating portion disposed between the first and second lattice portions;
    infiltrating interstices of the first lattice portion with a first conductive material and infiltrating interstices of the second lattice portion with a second conductive material, each of the first and second conductive materials filling the interstices to reach a predetermined thickness on the substrate;
    removing the solid structure and the lattice structure from the substrate, thereby forming first and second conductive scaffolds from the first and second conductive materials, the first and second conductive scaffolds comprising a porosity defined by the lattice structure and having a lateral size and shape defined by walls of the solid structure.

2. The method of claim 1, further comprising:
    conformally depositing an anode active material on the second conductive scaffold to form a porous anode; and
    conformally depositing a cathode active material on the first conductive scaffold to form a porous cathode.

3. The method of claim 1, wherein the solid structure surrounds the first and second lattice portions on all sides.

4. The method of claim 1, wherein one or more of the walls of the solid structure are normal to the substrate.

5. The method of claim 1, wherein the lattice structure is formed before the solid structure is formed.

6. The method of claim 1, wherein the lattice structure is formed after the solid structure is formed.

7. The method of claim 1, wherein forming the microbattery template comprises:
    applying a photoresist to the substrate;
    patterning the photoresist using a 2D pattern to form the solid structure;

patterning the photoresist using a 3D pattern to form the lattice structure.

8. The method of claim 7,
wherein patterning the photoresist using the 2D pattern comprises:
exposing the photoresist to light passing through a 2D mask pattern to create in the photoresist at least one mask-defined exposed region and at least one mask-defined unexposed region, and
developing the photoresist to selectively remove the at least one mask-defined exposed region or the at least one mask-defined unexposed region from the substrate, thereby forming the solid structure, and
wherein patterning the photoresist using the 3D pattern comprises:
exposing the photoresist to a 3D interference pattern of light comprising areas of constructive interference and destructive interference to create in the photoresist a plurality of interference-defined exposed regions and a plurality of interference-defined unexposed regions, and
developing the photoresist to selectively remove the plurality of interference-defined exposed regions or the plurality of interference-defined unexposed regions, thereby forming the lattice structure.

9. The method of claim 8, wherein the photoresist comprises a negative photoresist, and wherein the photoresist is developed only after the exposure of the photoresist to the 2D mask pattern and to the 3D interference pattern, thereby selectively removing the plurality of interference-defined unexposed regions and the at least one mask-defined unexposed region substantially simultaneously.

10. The method of claim 7, further comprising reapplying the photoresist to the substrate after patterning the photoresist with the 2D pattern or with the 3D pattern, such that one of the solid structure and the lattice structure is formed after the reapplying of the photoresist.

11. The method of claim 1, wherein forming the microbattery template comprises:
applying a first photoresist to the substrate;
patterning the first photoresist using a 2D pattern to form the solid structure;
applying a second photoresist of opposite tone to the first photoresist to the substrate;
patterning the second photoresist using a 3D pattern to form the lattice structure.

12. The method of claim 11, wherein patterning the first photoresist comprises:
exposing the first photoresist to light passing through a 2D mask pattern to create in the first photoresist at least one mask-defined exposed region and at least one mask-defined unexposed region, and
developing the first photoresist to selectively remove the at least one mask-defined exposed region or the at least one mask-defined unexposed region from the substrate, thereby forming the solid structure, and
wherein patterning the second photoresist comprises:
exposing the second photoresist to a 3D interference pattern of light comprising areas of constructive interference and destructive interference to create in the second photoresist a plurality of interference-defined exposed regions and a plurality of interference-defined unexposed regions, and
developing the second photoresist to selectively remove the plurality of interference-defined exposed regions or the plurality of interference-defined unexposed regions, thereby forming the lattice structure.

13. The method of claim 12, wherein the first photoresist comprises a negative photoresist and the at least one mask-defined unexposed region is selectively removed from the substrate, and
wherein the second photoresist comprises a positive photoresist and the plurality of interference-defined exposed regions are selectively removed from the substrate.

14. The method of claim 12, wherein the first photoresist comprises a positive photoresist and the at least one mask-defined exposed region is selectively removed from the substrate, and
wherein the second photoresist comprises a negative photoresist and the plurality of interference-defined unexposed regions are selectively removed from the substrate.

15. The method of claim 1, wherein forming the microbattery template comprises:
depositing a colloidal solution comprising a plurality of microparticles onto the surface, the microparticles assembling into the lattice structure;
applying a photoresist to the substrate;
patterning the photoresist using a 2D pattern to form the solid structure.

16. The method of claim 15, wherein patterning the photoresist using the 2D pattern comprises:
exposing the photoresist to light passing through a 2D mask pattern to create in the photoresist at least one mask-defined exposed region and at least one mask-defined unexposed region, and
after the exposure, developing the photoresist to selectively remove the at least one mask-defined exposed region or the at least one mask-defined unexposed region from the substrate, thereby forming the solid structure.

17. The method of claim 1, wherein each of the first conductive material and the second conductive material comprises at least one element selected from the group consisting of: C, Co, Cr, Cu, Ag, Au, W, Mn, Mo, Zn, Ni, Pt, Re, Sn, Ti, Ta, Al, Si, N, and Fe.

18. The method of claim 1, wherein an electrically conductive coating is deposited on the substrate prior to forming the lattice structure and the solid structure, and further comprising patterning the electrically conductive coating, thereby forming first and second conductive patterns on the substrate.

19. The method of claim 18, wherein the first and second conductive patterns are formed after forming the lattice structure and the solid structure.

20. The method of claim 18, wherein the first and second conductive patterns are formed prior to forming the lattice structure and the solid structure.

* * * * *